US012593562B2

(12) United States Patent
Yao

(10) Patent No.: US 12,593,562 B2
(45) Date of Patent: Mar. 31, 2026

(54) ORGANIC LIGHT-EMITTING DEVICE AND DISPLAY PANEL

(71) Applicant: YUNGU (GU'AN) TECHNOLOGY CO., LTD., Langfang (CN)

(72) Inventor: Chunliang Yao, Langfang (CN)

(73) Assignee: Yungu (Gu'an) Technology., Ltd., Langfang (CN)

( * ) Notice: Subject to any disclaimer, the term of this patent is extended or adjusted under 35 U.S.C. 154(b) by 1029 days.

(21) Appl. No.: 17/715,622

(22) Filed: Apr. 7, 2022

(65) Prior Publication Data

US 2022/0231252 A1 Jul. 21, 2022

Related U.S. Application Data

(63) Continuation of application No. PCT/CN2021/084011, filed on Mar. 30, 2021.

(30) Foreign Application Priority Data

May 27, 2020 (CN) .......................... 202010462196.1

(51) Int. Cl.
*H10K 50/165* (2023.01)
*H10K 50/11* (2023.01)
(Continued)

(52) U.S. Cl.
CPC ........... *H10K 50/165* (2023.02); *H10K 50/11* (2023.02); *H10K 50/166* (2023.02);
(Continued)

(58) Field of Classification Search
CPC ....... H10K 50/131; H10K 50/13; H10K 50/19
See application file for complete search history.

(56) References Cited

U.S. PATENT DOCUMENTS

2015/0155513 A1 6/2015 Pieh et al.
2016/0104844 A1* 4/2016 Kang ................. H10K 85/6574
257/40

(Continued)

FOREIGN PATENT DOCUMENTS

CN 105514287 A 4/2016
CN 107180917 A 9/2017
(Continued)

OTHER PUBLICATIONS

International Search Report and Written Opinion (International Application No. PCT/CN2021/084011) with English Translation, dated Jul. 12, 2021, 14 pages.
Chinese First Office Action 100191 (CN Application No. 202010462196.1) and Search Result with English Translation, dated Oct. 11, 2021, 14 pages.
(Continued)

*Primary Examiner* — Sean M DeGuire
(74) *Attorney, Agent, or Firm* — Quarles & Brady LLP

(57) ABSTRACT

The present disclosure provides an organic light-emitting device and a display panel. The organic light-emitting device includes a plurality of layers stacked with each other between an anode and a cathode. The plurality of layers includes a first hole transport layer, a first light-emitting layer, a first electron transport layer, an n-type charge generation layer, and a p-type charge generation layer stacked in sequence. The n-type charge generation layer includes a matrix, a first dopant, and a second dopant. The matrix is a first electron transport organic material, the first dopant is a metal quinoline complex, and the second dopant is selected from the group consisting of a rare earth metal, an alkali metal, an alkaline-earth metal, and any combination thereof. Or the matrix is a first electron transport organic material, the first dopant is a metal quinoline complex, and the second dopant is an n-type organic material.

16 Claims, 8 Drawing Sheets

| cathode 120 |
| --- |
| ETL2 138 |
| EML2 137 |
| HTL2 136 |
| P-CGL 135 |
| N-CGL 134 |
| ETL1 133 |
| EML1 132 |
| HTL1 131 |
| anode 110 |

(51) Int. Cl.
| | | |
|---|---|---|
| *H10K 50/16* | (2023.01) | |
| *H10K 85/30* | (2023.01) | |
| *H10K 85/60* | (2023.01) | |
| *H10K 101/30* | (2023.01) | |
| *H10K 101/40* | (2023.01) | |
| *H10K 102/00* | (2023.01) | |

(52) U.S. Cl.
CPC ........... *H10K 85/321* (2023.02); *H10K 85/30* (2023.02); *H10K 85/6572* (2023.02); *H10K 2101/30* (2023.02); *H10K 2101/40* (2023.02); *H10K 2102/351* (2023.02)

(56) References Cited

U.S. PATENT DOCUMENTS

| | | |
|---|---|---|
| 2016/0181561 A1 | 6/2016 | Lee et al. |
| 2017/0263876 A1* | 9/2017 | Kim .................... H10K 50/165 |

FOREIGN PATENT DOCUMENTS

| | | |
|---|---|---|
| CN | 107464884 A | 12/2017 |
| CN | 104681729 B | 9/2018 |
| CN | 109742250 A | 5/2019 |
| CN | 111554823 A | 8/2020 |

* cited by examiner

| cathode 120 |
|:---:|
| ETL2 138 |
| EML2 137 |
| HTL2 136 |
| P-CGL 135 |
| N-CGL 134 |
| ETL1 133 |
| EML1 132 |
| HTL1 131 |
| anode 110 |

FIG. 1

P-CGL 135 — 135

| N1 N1 N1 N1 N1 N1 N1 N1 N1 N1 N1 N1 N1 N1 N1 D N1 N1 N1 N1 N1 |

— 134

ETL1 133 — 133

FIG. 4

ORGANIC LIGHT-EMITTING DEVICE AND DISPLAY PANEL

CROSS-REFERENCE TO RELATED APPLICATIONS

This application is a continuation to international patent application PCT/CN2021/084011, filed on Mar. 30, 2021, which claims priority to Chinese Patent Application No. 202010462196.1, filed on May 27, 2020, the contents of both applications are hereby incorporated by reference in their entireties.

TECHNICAL FIELD

The present disclosure relates to the field of display technology.

BACKGROUND

The organic light-emitting diode (OLED) has been commercially used in the field of display technology due to its advantages of high response speed, high color purity, wide view angle, foldability, and low energy consumption, etc.

SUMMARY

The present disclosure provides for an organic light-emitting device and a display device.

In an aspect of the present disclosure, an organic light-emitting device is provided. The organic light-emitting device includes an anode, a cathode, and a plurality of layers that are stacked between the anode and the cathode. The plurality of layers includes a first hole transport layer, a first light-emitting layer, a first electron transport layer, an n-type charge generation layer, and a p-type charge generation layer stacked in sequence. The n-type charge generation layer includes a matrix, a first dopant, and a second dopant. The matrix is a first electron transport organic material, the first dopant is a metal quinoline complex, and the second dopant is selected from the group consisting of a rare earth metal, an alkali metal, an alkaline-earth metal, and any combination thereof; or the matrix is a first electron transport organic material, the first dopant is a metal quinoline complex, and the second dopant is an n-type organic material.

In another aspect of the present disclosure, a display panel including the above-described organic light-emitting device is provided.

In the present disclosure, by doping the metal quinoline complex in the n-type charge generation layer, the driving voltage of the organic light-emitting device is decreased, the lifetime of the organic light-emitting device is prolonged, and the stability of the organic light-emitting device is improved.

BRIEF DESCRIPTION OF THE DRAWINGS

FIG. 1 is a schematic sectional structural view of an organic light-emitting device according to an embodiment of the present disclosure.

FIG. 4 is a schematic sectional structural view, showing yet another embodiment of the n-type charge generation layer, in which the first electron transport organic material, the metal quinoline complex, and the rare earth metal are distributed non-uniformly, of the organic light-emitting device shown in FIG. 1.

DETAILED DESCRIPTION

Figure 2:
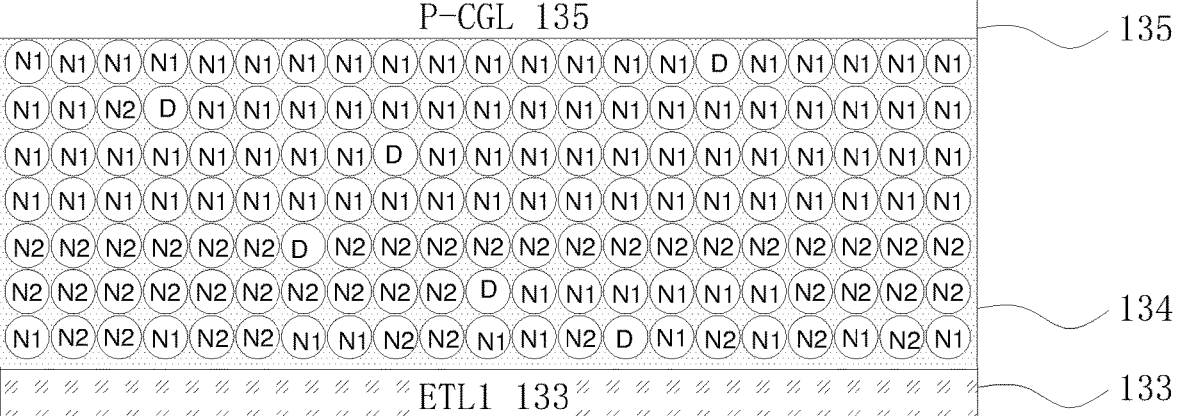
FIG. 2 is a schematic sectional structural view, showing an embodiment of an n-type charge generation layer of the organic light-emitting device shown in FIG. 1.

The present disclosure will be described in detail below with reference to the accompanying drawings and the embodiments. It should be understood that the specific embodiments described herein are only used to illustrate the present disclosure rather than to limit the present disclosure. In addition, for convenience of description, only part but not all structures related to the present disclosure are shown in the accompanying drawings.

The lifetime of the organic light-emitting device is one of the most important factors in determining the performance of the device in use. The lifetime of the device can be significantly increased by adopting a layer stack structure. However, the increase in operating voltage of the organic light-emitting device is accelerated and the lifetime of the organic light-emitting device is reduced as the number of the stacked layers increases. In addition, the instability of the metal doped charge generation layer can also lead to the accelerated increase in the operating voltage of the device, which will adversely affect the performance of the device in use. An n-type charge generation layer of an organic light-emitting device includes an electron transport of organic material and a dopant doped in the electron transport of organic material. The dopant is one or more of rare earth metals, alkali metals, and alkaline-earth metals. The stability of the organic light-emitting device may be adjusted by material selection, which is limited. The doped n-type charge generation layer is not sufficiently stable, which accelerates the increase in the operating voltage of the organic light-emitting device, which reduces the lifetime of the organic light-emitting device, and thus adversely affects the performance of the organic light-emitting device in use.

In the present disclosure, to address the above-described problem, an n-type charge generation layer is formed by blending a metal quinoline complex, a first electron transport of organic material, and a rare earth metal, or by blending a metal quinoline complex, a first electron transport organic material, and an n-type organic material, which reduces the energy level difference at an interface between the n-type charge generation layer and the light-emitting layer, thereby decreasing the driving voltage of the organic light-emitting device, prolonging the lifetime of the organic light-emitting device, and improving the stability of the organic light-emitting device.

Referring to FIGS. 1 to 4, an organic light-emitting device includes a plurality of layers stacked with each other between an anode 110 and a cathode 120. The plurality of layers includes a first hole transport layer 131 (HTL1), a first light-emitting layer 132 (EML1), a first electron transport layer 133 (ETL1), an n-type charge generation layer 134 (N-CGL), and a p-type charge generation layer 135 (P-CGL) stacked in sequence. The n-type charge generation layer 134 includes a matrix, a first dopant, and a second dopant. In an embodiment, the matrix is a first electron transport organic material N1, the first dopant is a metal quinoline complex N2, and the second dopant is selected from the group consisting of a rare earth metal D, an alkali metal, an alkaline-earth metal, and any combination thereof. In another embodiment, the matrix includes the first electron transport organic material N1, the first dopant includes the metal quinoline complex N2, and the second dopant includes an n-type organic material.

As shown in FIG. 1, the anode 110 can be a transparent electrode, a semi-transparent electrode, and the like. The transparent electrode is made of a transparent conductive material, such as indium tin oxide (ITO) or indium zinc oxide (IZO). The semi-transparent electrode is made of a mixture of a transparent conductive material, such as indium tin oxide (ITO) or indium zinc oxide (IZO), and a non-transparent conductive material, such as aluminum (Al), gold (Au), molybdenum (Mo), chromium (Cr), copper (Cu), or LiF. The cathode 120 can be a light-reflective electrode made of a light-reflective metal material, such as aluminum (Al), gold (Au), molybdenum (Mo), chromium (Cr), copper (Cu), LiF, and any combination thereof. The light-reflective electrode can be a multi-layer structure with the characteristics of the above materials. In the case where the anode 110 is a semi-transparent electrode and the cathode 120 is a light-reflective electrode, the organic light-emitting device is a bottom-emitting structure, in which lights are emitted from the bottom of the device in FIG. 1 as an example. In the case where the cathode 120 is a semi-transparent electrode and the anode 110 is a light-reflective electrode, the organic light-emitting device is a top-emitting structure, in which lights are emitted from the top of the device in FIG. 1 as an example. Optionally, both the cathode 120 and the anode 110 are transparent electrodes, so that the organic light-emitting device is a bilaterally emitting structure, in which lights are emitted from both sides.

In an embodiment, the first light-emitting layer 132 includes a fluorescent or phosphorescent blue dopant and a matrix, and is configured to emit blue lights. In another embodiment, the first light-emitting layer 132 includes a fluorescent or phosphorescent green dopant and a matrix, and is configured to emit green lights. In yet another embodiment, the first light-emitting layer 132 includes a fluorescent or phosphorescent red dopant and a matrix, and is configured to emit red lights.

The alkali metal is selected from the group consisting of lithium (Li), sodium (Na), potassium (K), rubidium (Rb), cesium (Cs), francium (Fr), and any combination thereof. The alkali-earth metal is selected from the group consisting of beryllium (Be), magnesium (Mg), calcium (Ca), strontium (Sr), barium (Ba), radium (Ra), and any combination thereof. The rare earth metal is selected from the group consisting of gadolinium (Gd), terbium (Tb), dysprosium (Dy), holmium (Ho), erbium (Er), thulium (Tm), ytterbium (Yb), lutetium (Lu), and any combination thereof. In an embodiment of the present disclosure, the dopant is ytterbium (Yb). The dopant can also be one or a combination of the alkali metal, the alkali-earth metal, and the rare earth metal.

The metal quinoline complex is not specifically limited in the present disclosure, as long as it can be used to achieve the concept of the present disclosure. In an embodiment, the metal quinoline complex N2 is 8-hydroxyquinolinato lithium or 8-hydroxyquinolinato aluminum.

The first electron transport organic material N1 can be selected from the group consisting of 2,9-dimethyl-4,7-biphenyl-1,10-phenanthroline (BCP), 4,7-diphenyl-1,10-phenanthroline (Bphen), 1,3,5-tri(1-phenyl-1H-benzimidazol-2-yl)benzene (TPBi), and any combination thereof.

The n-type organic material can be selected from the group consisting of 2,9-dimethyl-4,7-biphenyl-1,10-phenanthroline (BCP), 4,7-diphenyl-1,10-phenanthroline (Bphen), 1,3,5-tri(1-phenyl-1H-benzimidazol-2-yl)benzene (TPBi), and any combination thereof. The n-type organic material is different from the first electron transport organic material N1 in the present disclosure.

In an embodiment, the mass percent of the metal quinoline complex doped in the n-type charge generation layer 134 is 10% to 30%, and the mass percent of the second dopant doped in the n-type charge generation layer 134 is 1% to 5%. In an embodiment, the mass percent of the metal quinoline complex doped in the n-type charge generation layer 134 can be 20%, and the mass percent of the second dopant doped in the n-type charge generation layer 134 can be 3%.

In an embodiment, the lowest unoccupied molecule orbital (LUMO) energy level difference between the n-type charge generation layer 134 and the first electron transport layer 133 is smaller than or equal to 0.3 eV. The lowest unoccupied molecule orbital (LUMO) energy level difference between the n-type charge generation layer 134 and the first electron transport layer 133 is actually determined by the energy level difference between the materials of the two layers. With the lowest unoccupied molecule orbital (LUMO) energy level difference smaller than or equal to 0.3 eV, the energy barrier in the electron transport process can be reduced, thereby reducing the driving voltage.

Figure 3:
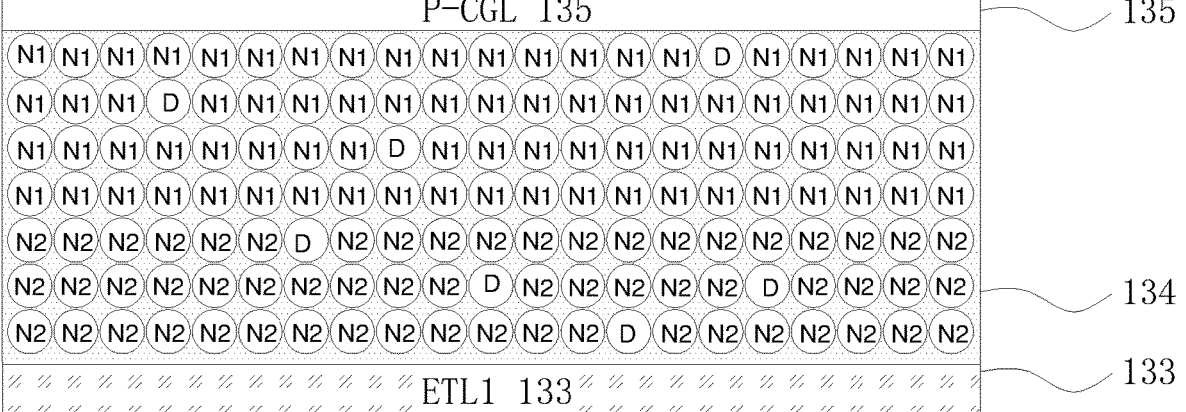
FIG. 3 is a schematic sectional structural view showing another embodiment of the n-type charge generation layer, in which a first electron transport organic material, a metal quinoline complex, and a rare earth metal are distributed non-uniformly, of the organic light-emitting device shown in FIG. 1.
Figure 4:
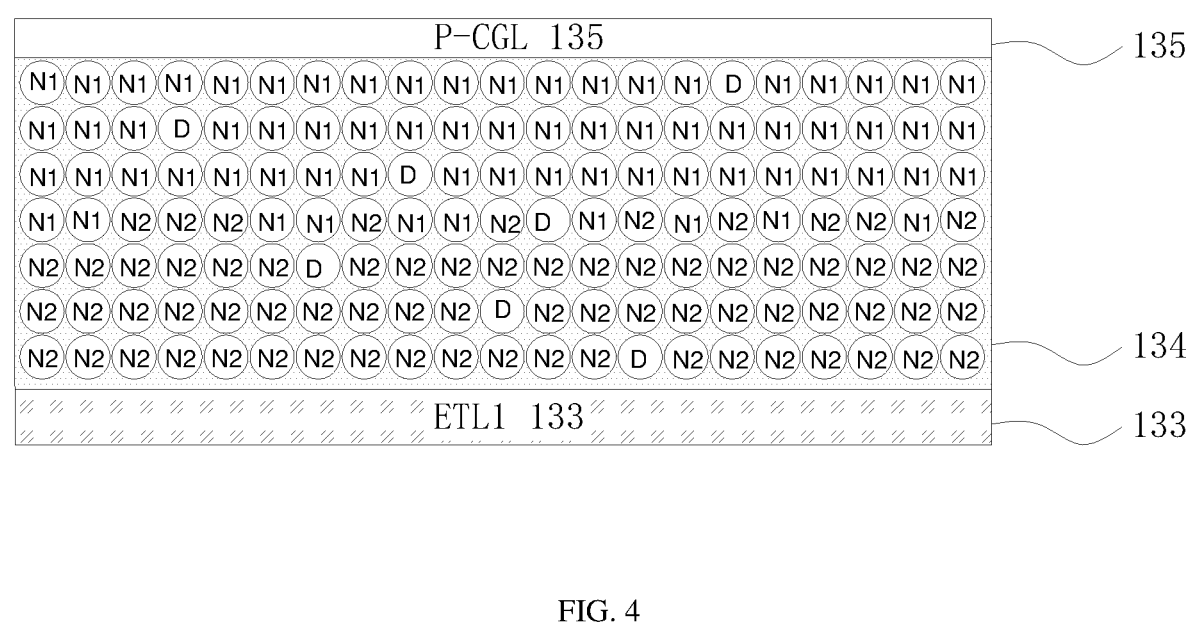

As shown in FIGS. 2 to 4, the first electron transport organic material N1, the metal quinoline complex N2, and the rare earth metal D are arranged irregularly in the n-type charge generation layer 134 (N-CGL), although the first electron transport organic material N1, the metal quinoline complex N2, and the rare earth metal D are to be blended uniformly in theory. The doping with the metal quinoline complex N2 can decrease the lowest unoccupied molecule orbital (LUMO) energy level difference between the n-type charge generation layer 134 and the first electron transport layer 133. Therefore, less energy is required for the electrons to be transported from the n-type charge generation layer 134 to the first electron transport layer 133 (ETL1). As a result, the transmission rate is increased, the driving voltage of the organic light-emitting device is decreased, the lifetime of the organic light-emitting device is prolonged, and the stability of the organic light-emitting device is improved.

In an embodiment, the organic light-emitting device further includes a second hole transport layer 136 (HTL2), a second light-emitting layer 137 (EML2), and a second electron transport layer 138 (ETL2) stacked in sequence. The second hole transport layer 136 is disposed at a side of the p-type charge generation layer 135 away from the first electron transport layer 133. By stacking the plurality of layers, the transportation of electrons and holes can be achieved and the luminance of the light-emitting layer can be regulated to meet the requirement for the performance of the product.

In an embodiment, the thickness of the n-type charge generation layer 134 is 10 nm to 30 nm. In an embodiment, the thickness of the n-type charge generation layer 134 can be 15 nm, 20 nm, or 25 nm. The purpose of controlling the thickness of the n-type charge generation layer 134 is to prevent an acceleration of the operating voltage increase of the organic light-emitting device with the increase of the layer thickness, which will reduce the lifetime of the organic light-emitting device.

In an embodiment, the p-type charge generation layer 135 includes a hole transport organic material as a matrix and a p-type organic material as a dopant. In an embodiment, a small amount of material used for the hole transport layer can be doped in the p-type charge generation layer 135 to partially decrease the barrier gap at an interface between the p-type charge generation layer 135 and the second hole transport layer 136, cause effective charge separation, decrease the driving voltage of the device, and prolong the lifetime of the device.

In the present disclosure, the n-type charge generation layer 134 is formed by blending the metal quinoline complex, the first electron transport organic material, and the rare earth metal, or by blending the metal quinoline complex, the first electron transport organic material, and the n-type organic material, which reduces the energy level difference at an interface between the n-type charge generation layer and the light-emitting layer, decreases the driving voltage of the organic light-emitting device, prolongs lifetime of the organic light-emitting device, and improves the stability of the organic light-emitting device.

Figure 5:
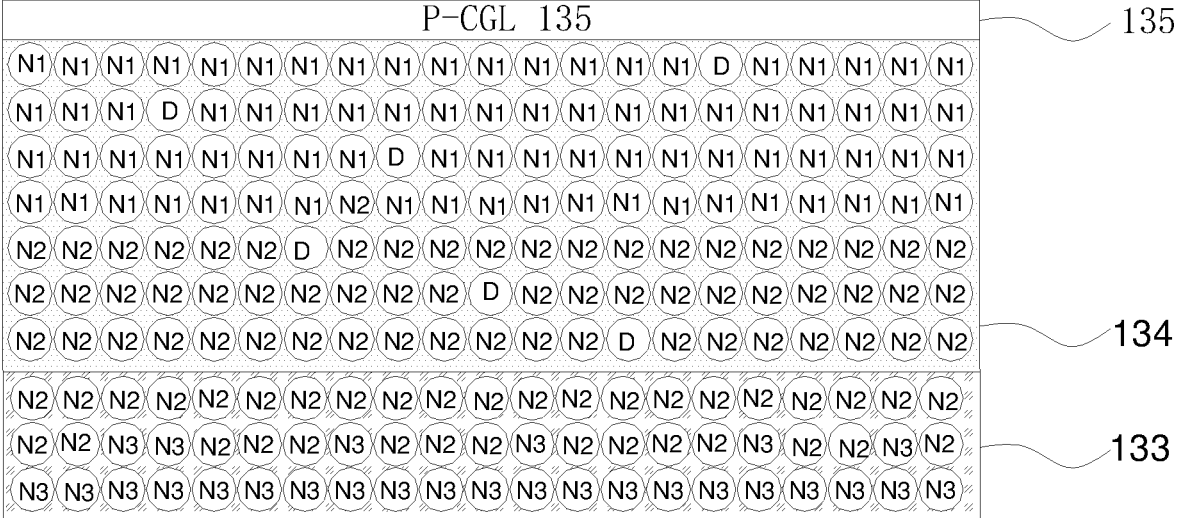
FIG. 5 is a schematic sectional structural view, showing an embodiment of a first electron transport layer, in which a second electron transport organic material and the metal quinoline complex are distributed non-uniformly, of the organic light-emitting device having the n-type charge generation layer shown in FIG. 3.
Figure 6:
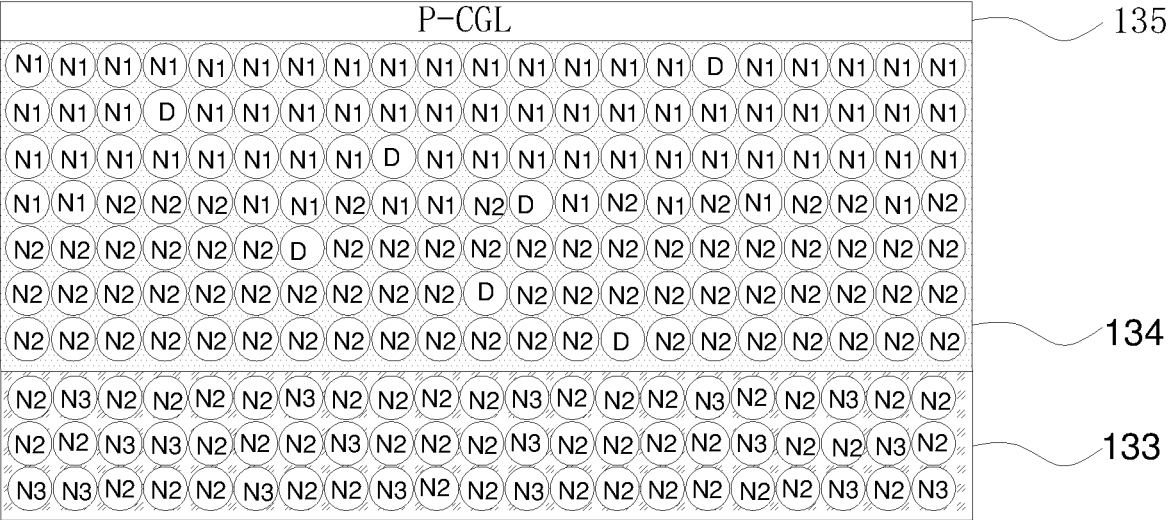
FIG. 6 is a schematic sectional structural view, showing another embodiment of the first electron transport layer, in which a second electron transport organic material and the metal quinoline complex are distributed non-uniformly, of the organic light-emitting device having the n-type charge generation layer shown in FIG. 4.

Referring to FIGS. 5 to 6, an organic light-emitting device includes a plurality of layers stacked with each other between an anode 110 and a cathode 120. The plurality of layers includes a first hole transport layer 131 (HTL1), a first light-emitting layer 132 (EML1), a first electron transport layer 133 (ETL1), an n-type charge generation layer 134 (N-CGL), and a p-type charge generation layer 135 (P-CGL) stacked in sequence. The n-type charge generation layer 134 includes a matrix, a first dopant, and a second dopant. In an embodiment, the matrix is a first electron transport organic material N1, the first dopant is a metal quinoline complex N2, and the second dopant is selected from the group consisting of a rare earth metal D, an alkali metal, an alkaline-earth metal, and any combination thereof. In another embodiment, the matrix is the first electron transport organic material N1, the first dopant is the metal quinoline complex N2, and the second dopant is an n-type organic material. The first electron transport layer 133 includes a second electron transport organic material N3 as a matrix and the metal quinoline complex N2 as a dopant.

The second electron transport organic material is selected from the group consisting of 2,9-dimethyl-4,7-biphenyl-1, 10-phenanthroline (BCP), 4,7-diphenyl-1,10-phenanthroline (Bphen), 1,3,5-tri(1-phenyl-1H-benzimidazol-2-yl)benzene (TPBi), and any combination thereof. The first electron transport organic material and the second electron transport organic material can be the same material or different materials, which can be selected according to the need of the organic light-emitting device. The materials of the first electron transport organic material and the second electron transport organic material are not specifically limited herein.

In an embodiment, the lowest unoccupied molecule orbital (LUMO) energy level difference between the first electron transport organic material and the second electron transport organic material is smaller than or equal to 0.3 V, which can meet the need of the organic light-emitting device.

In an embodiment, the mass percent of the metal quinoline complex doped in the first electron transport layer 133 is 30% to 50%, for example, 35%, 40%, 45%, or 50%. Generally, the mass percent of a dopant should not be more than 50%, while the increase in doping ratio is beneficial to reduce the energy level difference between layers, increase the contact force at the interface between layers, and increase the electron transmission rate.

Referring to FIGS. 5 to 6, the first electron transport organic material N1, the metal quinoline complex N2, and the rare earth metal D are arranged irregularly, i.e., distributed non-uniformly, in the n-type charge generation layer 134 (N-CGL), although the first electron transport organic material N1, the metal quinoline complex N2, and the rare earth metal D are to be blended uniformly in theory. The second electron transport organic material N3 and the metal quinoline complex N2 can also be arranged irregularly, i.e., distributed non-uniformly, in the first electron transport layer 133. More specifically, the metal quinoline complexes N2 in both the n-type charge generation layer 134 and the first electron transport layer 133 are arranged close to the interface between the n-type charge generation layer 134 and the first electron transport layer 133. Both the n-type charge generation layer 134 and the first electron transport layer 133 are doped with a small amount of metal quinoline complex N2, so that the barrier gap at the interface between the n-type charge generation layer 134 and the first electron transport layer 133 are partially decreased, an effective charge separation is obtained, and the contact force at the interface between the n-type charge generation layer 134 and the first electron transport layer 133 is increased, thereby enhancing the electron transport capacity and decreasing the driving voltage of the organic light-emitting device, which is beneficial to prolong the lifetime of the organic light-emitting device and keep the stability of the organic light-emitting device.

In the present disclosure, by doping the metal quinoline complex N2 in both the n-type charge generation layer 134 and the first electron transport layer 133, the interface contact between the n-type charge generation layer 134 and the first electron transport layer 133 is improved, the electron transport capacity is increased, the energy level difference at the interface between the n-type charge generation layer 134 and the first electron transport layer 133 is reduced, and so that the driving voltage of the organic light-emitting device is decreased, the lifetime of the organic light-emitting device is prolonged, and the stability of the organic light-emitting device is improved.

Table 1 shows data obtained in related tests for the organic light-emitting devices in Comparative Example, Example 1, and Example 2, wherein all the first electron transport layers 133 are doped with 50% (mass percent) of 8-hydroxyquinolinato lithium. N2 in Table 1 is 8-hydroxyquinolinato lithium.

TABLE 1

| IVL ID | N-CGL | L nits | $V_d$ (V) | Eff. (cd/A) | LT (20 h) LT | ΔV |
|---|---|---|---|---|---|---|
| Comparative Example | N2 = 0% | 750 | 8.19 | 8.9 | 98.6% | 0.287 |
| Example 1 | N2 = 20% | | 8.03 | 8.8 | 99.4% | 0.197 |
| Example 2 | N2 = 50% | | 8.25 | 8.1 | 99.3% | 0.209 |

The n-type charge generation layers 134 (N-CGL) of the organic light-emitting devices in Comparative Example, Example 1, and Example 2 are respectively doped with 0%, 20%, and 50% (mass percent) of the metal quinoline complex N2 in the same environment. Then the performance of the devices is tested at the luminance of 750 nits. It can be seen from Table 1 that the initial voltages of the organic light-emitting devices with the n-type charge generation layers 134 respectively doped with 0%, 20%, and 50% (mass percent) of the metal quinoline complex N2 are respectively 8.19V, 8.03 V, and 8.25 V. The smaller the initial voltage of the organic light-emitting device, the smaller the power consumption of the organic light-emitting device, and the better the performance of the organic light-emitting device. The efficiencies (Eff for short) of the organic light-emitting devices with the n-type charge generation layers 134 respectively doped with 0%, 20%, and 50% (mass percent) of the metal quinoline complex N2 are respectively 8.9 cd/A, 8.8 cd/A, and 8.1 cd/A. The larger the efficiency of the organic light-emitting device, the smaller the voltage of the organic light-emitting device, and the smaller the current of the organic light-emitting device. The smaller the current of the organic light-emitting device, the smaller the power consumption of the organic light-emitting device, and the better the performance of the organic light-emitting device. In the lifetime (LT for short) attenuation test, with other conditions being the same, after 20 hours of attenuation, the lifetimes of the organic light-emitting devices with the n-type charge generation layers 134 respectively doped with 0%, 20%, and 50% (mass percent) of the metal quinoline complex N2 are respectively attenuated to 98.6%, 99.4%, and 99.3%. The larger the LT, the smaller the attenuation degree of the organic light-emitting device, and the longer the service time of the organic light-emitting device. The voltage difference (ΔV) is the difference between the initial voltage V and the voltage V1 after 20 hours of attenuation. The smaller the voltage difference, the longer the lifetime of the organic light-emitting device, and the longer the service time of the organic light-emitting device. In summary, from Table 1, it is obvious that the organic light-emitting device with the first electron transport layer 133 (ETL1) doped with 50% (mass percent) of 8-hydroxyquinolinato lithium (LiQ) and the n-type charge generation layers 134 (N-CGL) doped with 20% (mass percent) of 8-hydroxyquinolinato lithium (LiQ) has a better performance than that of the organic light-emitting device in the comparative example.

Figure 7A:
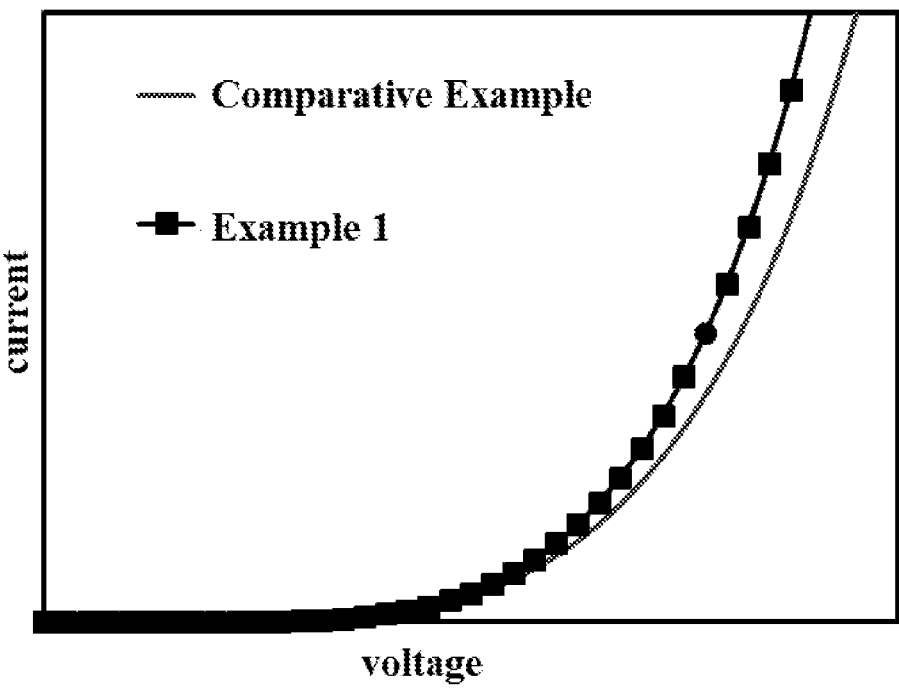
FIG. 7A shows curves of current varying with voltage of the organic light-emitting devices in Comparative Example and Example 1.

FIG. 7A shows curves of current varying with voltage of the organic light-emitting devices in Comparative Example and Example 1, obtained in combination with Table 1, on the condition that the luminance is 750 nits and the first electron transport layer 133 (ETL1) is doped with 50% (mass percent) of 8-hydroxyquinolinato lithium (LiQ). It can be seen from FIG. 7A that the current gradually increases with the increase of the voltage. At the same current, the voltage in Example 1 is significantly smaller than the voltage in Comparative Example, which suggests that Example 1 has smaller voltage when other conditions are the same. Therefore, compared with Comparative Example, the power consumption of the organic light-emitting device in Example 1 is smaller and the performance of the organic light-emitting device in Example 1 is better.

Figure 7B:
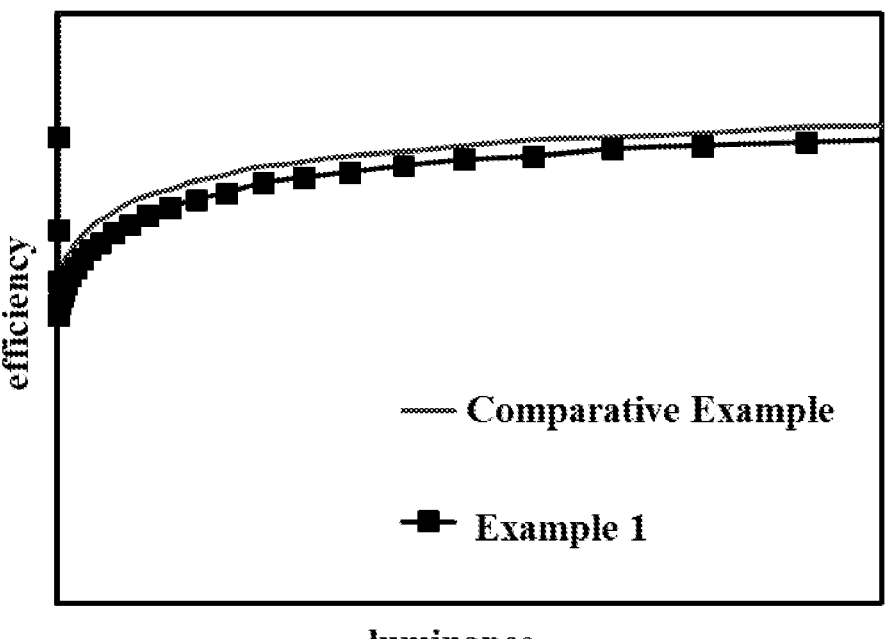
FIG. 7B shows curves of efficiency varying with luminance of the organic light-emitting devices in Comparative Example and Example 1.

FIG. 7B shows curves of efficiency varying with luminance of the organic light-emitting devices in Comparative Example and Example 1, obtained in combination with Table 1, on the condition that the luminance is 750 nits and the first electron transport layer 133 (ETL1) is doped with 50% (mass percent) of 8-hydroxyquinolinato lithium (LiQ). It can be seen from FIG. 7B that the efficiency variations in Comparative Example and Example 1 are substantially consistent with each other, suggesting that the efficiency in Example 1 can meet the production requirement.

Figures 7C, 7D:
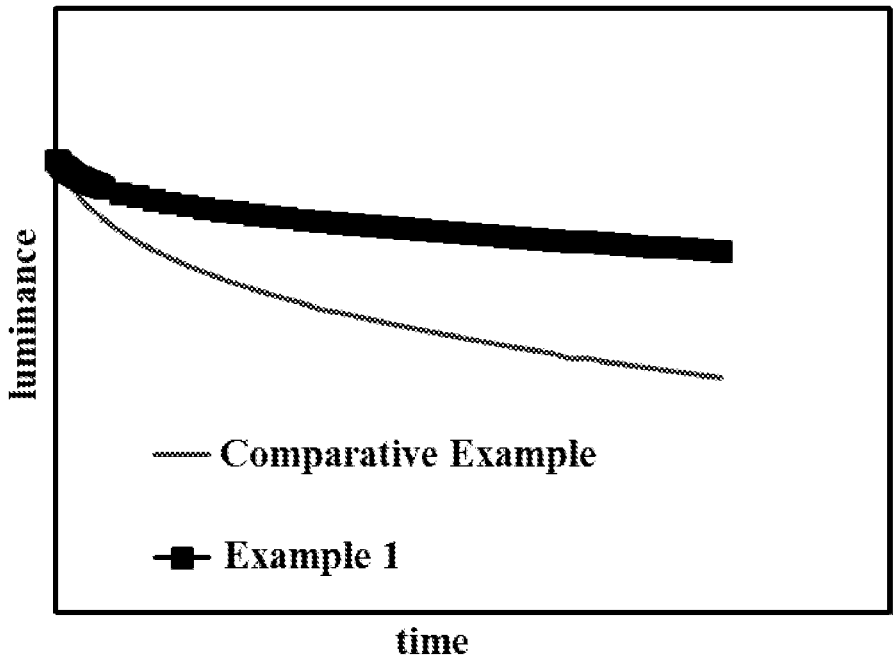
FIG. 7C shows curves of luminance varying with time of the organic light-emitting devices in Comparative Example and Example 1.
FIG. 7D shows curves of voltage change varying with time of the organic light-emitting devices in Comparative Example and Example 1.

FIG. 7C shows curves of luminance varying with time of the organic light-emitting devices in Comparative Example and Example 1, obtained in combination with Table 1, on the condition that the luminance (initial) is 750 nits and the first electron transport layer 133 (ETL1) is doped with 50% (mass percent) of 8-hydroxyquinolinato lithium (LiQ). It can be seen from FIG. 7C that at the same illumination time, the luminance in Example 1 is significantly larger than the luminance in Comparative Example 1. The larger the luminance at the same illumination time, the longer the lifetime and the service time of the organic light-emitting device.

FIG. 7D shows curves of voltage change varying with time of the organic light-emitting devices in Comparative Example and Example 1, obtained in combination with Table 1, on the condition that the luminance is 750 nits and the first electron transport layer 133 (ETL1) is doped with 50% (mass percent) of 8-hydroxyquinolinato lithium (LiQ). It can be seen from FIG. 7D that as the illumination time increases, the curve of Example 1 is more flat than the curve of Comparative Example. Therefore, at the same illumination time, the voltage change in Example 1 is significantly smaller than the voltage change in Comparative Example. The smaller the voltage change, the longer the lifetime and the service time of the organic light-emitting device.

The present disclosure further provides a display panel. The display panel includes the organic light-emitting device of any one of embodiments as described above. The display panel can be used in a display apparatus such as mobile phone and tablet computer.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

What is claimed is:

1. An organic light-emitting device, comprising:
   an anode;
   a cathode; and
   a plurality of layers stacked with each other between the anode and the cathode;
   wherein:
   the plurality of layers comprises a first hole transport layer, a first light-emitting layer, a first electron transport layer, an n-type charge generation layer, and a p-type charge generation layer stacked in sequence;
   the n-type charge generation layer comprises a matrix, a first dopant, and a second dopant; and
   the matrix comprises a first electron transport organic material, the first dopant comprises a first metal quinoline complex, and the second dopant is selected from the group consisting of a rare earth metal, an alkali metal, an alkaline-earth metal, and any combination thereof; or the matrix comprises a first electron transport organic material, the first dopant comprises a first metal quinoline complex, and the second dopant comprises an n-type organic material;

wherein:

a mass percent of the first metal quinoline complex doped in the n-type charge generation layer is 10% to 30%; and a mass percent of the second dopant doped in the n-type charge generation layer is 1% to 5%.

2. The organic light-emitting device of claim 1, wherein the first electron transport layer comprises a second electron transport organic material and a second metal quinoline complex doped in the second electron transport organic material.

3. The organic light-emitting device of claim 2, wherein each of the first metal quinoline complex and the second metal quinoline complex is 8-hydroxyquinolinato lithium or 8-hydroxyquinolinato aluminum.

4. The organic light-emitting device of claim 2, wherein the p-type charge generation layer comprises a hole transport organic material and a p-type organic material doped in the hole transport organic material.

5. The organic light-emitting device of claim 2, wherein the lowest unoccupied molecule orbital (LUMO) energy level difference between the first electron transport organic material and the second electron transport organic material is smaller than or equal to 0.3 eV.

6. The organic light-emitting device of claim 1, further comprising a second hole transport layer, a second light-emitting layer and a second electron transport layer stacked in sequence;

wherein the second hole transport layer is disposed at a side of the p-type charge generation layer away from the first electron transport layer.

7. The organic light-emitting device of claim 2, wherein a mass percent of the second metal quinoline complex doped in the first electron transport layer is 30% to 50%.

8. The organic light-emitting device of claim 2, wherein:

a mass percent of the first metal quinoline complex doped in the n-type charge generation layer is 20%; and a mass percent of the second metal quinoline complex doped in the first electron transport layer is 50%.

9. The organic light-emitting device of claim 1, wherein the first electron transport organic material is selected from the group consisting of 2,9-dimethyl-4,7-biphenyl-1,10-phenanthroline, 4,7-diphenyl-1,10-phenanthroline, 1,3,5-tri (1-phenyl-1H-benzimidazol-2-yl)benzene, and any combination thereof.

10. The organic light-emitting device of claim 2, wherein the second electron transport organic material is selected from the group consisting of 2,9-dimethyl-4,7-biphenyl-1, 10-phenanthroline, 4,7-diphenyl-1,10-phenanthroline, 1,3,5-tri (1-phenyl-1H-benzimidazol-2-yl)benzene, and any combination thereof.

11. The organic light-emitting device of claim 10, wherein the first electron transport organic material and the second electron transport organic material are the same organic material.

12. The organic light-emitting device of claim 2, wherein the first metal quinoline complex and the second metal quinoline complex are distributed non-uniformly in the n-type charge generation layer and the first electron transport layer, respectively.

13. The organic light-emitting device of claim 2, wherein the n-type charge generation layer is in contact with the first electron transport layer, forming an interface between the n-type charge generation layer and the first electron transport layer, the first metal quinoline complex and the second metal quinoline complex in both the n-type charge generation layer and the first electron transport layer are arranged adjacent to the interface between the n-type charge generation layer and the first electron transport layer.

14. The organic light-emitting device of claim 1, wherein the thickness of the n-type charge generation layer is 10 nm to 30 nm.

15. A display panel, comprising the organic light-emitting device of claim 1.

16. An organic light-emitting device, comprising:

an anode;

a cathode; and a plurality of layers stacked with each other between the anode and the cathode;

wherein:

the plurality of layers comprises a first hole transport layer, a first light-emitting layer, a first electron transport layer, an n-type charge generation layer, and a p-type charge generation layer stacked in sequence;

the n-type charge generation layer comprises a matrix, a first dopant, and a second dopant; and the matrix comprises a first electron transport organic material, the first dopant comprises a first metal quinoline complex, and the second dopant is selected from the group consisting of a rare earth metal, an alkali metal, an alkaline-earth metal, and any combination thereof; or the matrix comprises a first electron transport organic material, the first dopant comprises a first metal quinoline complex, and the second dopant comprises an n-type organic material;

wherein the first electron transport layer comprises a second electron transport organic material and a second metal quinoline complex doped in the second electron transport organic material;

wherein the first metal quinoline complex and the second metal quinoline complex are distributed non-uniformly in the n-type charge generation layer and the first electron transport layer, respectively.

* * * * *